United States Patent
Choi et al.

(10) Patent No.: US 7,848,165 B2
(45) Date of Patent: Dec. 7, 2010

(54) METHODS OF OPERATING PHASE-CHANGE RANDOM ACCESS MEMORY DEVICES

(75) Inventors: Chang-han Choi, Gyeonggi-do (KR); Ho-keun Cho, Gyeonggi-do (KR); Byung-gil Choi, Gyeonggi-do (KR); Ki-sung Kim, Seoul (KR); Jong-chul Park, Seoul (KR); Jong-soo Seo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 105 days.

(21) Appl. No.: 12/350,344

(22) Filed: Jan. 8, 2009

(65) Prior Publication Data

US 2009/0175072 A1    Jul. 9, 2009

(30) Foreign Application Priority Data

Jan. 9, 2008    (KR)    ......... 10-2008-002659

(51) Int. Cl.
*G11C 29/00* (2006.01)

(52) U.S. Cl. .......... 365/201; 365/148; 365/200; 365/185.09

(58) Field of Classification Search ......... 365/201, 365/185.09, 200, 148
See application file for complete search history.

(56) References Cited

U.S. PATENT DOCUMENTS

2006/0274574 A1* 12/2006 Choi et al. .......... 365/163
2008/0007986 A1* 1/2008 Jeong et al. .......... 365/96

FOREIGN PATENT DOCUMENTS

| JP | 2006-244561 | 9/2006 |
|---|---|---|
| KR | 100300036 B1 | 6/2001 |
| KR | 1020070073304 A | 7/2007 |

* cited by examiner

*Primary Examiner*—Hoai V Ho
*Assistant Examiner*—Anthan T Tran
(74) *Attorney, Agent, or Firm*—Myers Bigel Sibley & Sajovec, PA

(57) ABSTRACT

A phase-change random access memory (PRAM) device includes a plurality of banks, a plurality of column redundancy cell arrays, and a plurality of column redundancy write drivers. Each of the plurality of column redundancy cell arrays corresponds to at least one of the banks. Each of the plurality of column redundancy write drivers corresponds to at least one of the column redundancy cell arrays. The column redundancy write drivers are configured to transmit respective redundancy test data to the corresponding ones of the column redundancy cell arrays in response to a test control signal, which may be activated in response to each program pulse for writing data. Related test and access methods are also discussed.

12 Claims, 7 Drawing Sheets

US 7,848,165 B2

METHODS OF OPERATING PHASE-CHANGE RANDOM ACCESS MEMORY DEVICES

CROSS-REFERENCE TO RELATED PATENT APPLICATION

This application claims priority from Korean Patent Application No. 10-2008-0002659, filed on Jan. 9, 2008, in the Korean Intellectual Property Office, the disclosure of which is incorporated by reference herein in its entirety.

FIELD OF THE INVENTION

The present invention relates to semiconductor memory devices, and more particularly, to phase-change random access memory (PRAM) devices.

BACKGROUND OF THE INVENTION

Phase-change random access memories (PRAMs) are non-volatile memories that store data using materials, such as Ge—Sb—Te (GST) and/other phase-change materials, in which the resistance may change upon transition between amorphous and crystalline states, for example, due to a change in temperature. PRAMs may offer non-volatility and lower power consumption in addition to the advantages of dynamic random access memories (DRAMs), and thus may be regarded as a next generation memory.

FIG. 1 is an equivalent circuit diagram of a unit cell C of a PRAM device.

FIG. 2 is a cross-sectional view of a memory device ME including the phase-change material GST of FIG. 1.

Referring to FIGS. 1 and 2, the unit cell C of the PRAM device includes the memory device ME and a P-N diode D. A bit line BL is connected to the phase-change material GST which is connected to a P-junction of the P-N diode D, and a word line WL is connected to an N-junction of the P-N diode D. Alternatively, the PRAM device may include a transistor (not shown) connected to the phase-change material GST instead of the P-N diode D.

The memory device ME includes the phase-change material GST. A phase-change material (Ge—Sb—Tb) of a PRAM cell may transition between a crystalline state and an amorphous state depending on the temperature and/or duration of heating applied to the phase-change material, thereby storing data in the PRAM cell. In general, a temperature above about 900° C. may be required for a phase transition of the phase-change material. Such high temperatures may be obtained by Joule heating caused by current flowing through the PRAM cell.

If the current is supplied to a bottom electrode BEC of the memory device ME, the volume and state of a PGM, e.g., a contact region between the phase-change material GST and the bottom electrode BEC, is changed so as to provide the state of the phase-change material GST.

FIG. 3 is a graph illustrating the characteristics of the phase-change material GST of FIGS. 1 and 2. Here, "CON1" indicates conditions for changing the phase-change material GST to an amorphous state, and "CON0" indicates conditions for changing the phase-change material GST to a crystalline state. Referring to FIGS. 1 to 3, a write operation and a read operation of the PRAM device will be described.

First, a write operation will be described. In order to store data "1", the phase-change material GST is heated to a temperature above its melting temperature TMP2 (t1), and then rapidly cooled. Then, the phase-change material GST goes into an amorphous state defined as data "1" and referred to as a reset state. In order to store data "0", the phase-change material GST is heated to a temperature above its crystalline temperature TMP1 for a predetermined period of time (t2), and gradually cooled. Then, the phase-change material GST goes into a crystalline state defined as data "0" and referred to as a set state.

Next, a read operation will be described. The bit line BL and the word line WL are selected in order to select a memory cell C that is to be read. A read current is supplied to the selected memory cell C to determine whether data stored in the selected memory cell C is "1" or "0", based on a voltage change caused by a resistance of the phase-change material GST of the selected memory cell C. The resistance of the memory cell C may differ based on whether the phase change material GST is in the amorphous or crystalline state.

Cell defects may cause operational errors in a highly integrated PRAM, and thus, a redundancy cell array may be used to compensate for the cell defects. However, access to redundant cells may require a longer time than access to normal cells in banks during redundancy cell test operations since the number of input/output lines used to transmit test data may be limited. Furthermore, a redundancy cell test may require considerably more time than a conventional cell test.

SUMMARY

According to some embodiments of the present invention, a phase-change random access memory (PRAM) device includes a plurality of banks, a plurality of column redundancy cell arrays, and a plurality of column redundancy write drivers. Each of the plurality of column redundancy cell arrays corresponds to at least one of the banks. Each of the plurality of column redundancy write drivers corresponds to at least one of the column redundancy cell arrays. The column redundancy write drivers are configured to transmit respective redundancy test data to the corresponding ones of the column redundancy cell arrays in response to a test control signal.

In some embodiments, the plurality of column redundancy write drivers may be configured to write the respective redundancy test data to the corresponding ones of the column redundancy cell arrays simultaneously in response to the test control signal.

In other embodiments, each of the plurality of banks may include at least one input/output line configured to be activated in response to one of a plurality of program pulses for writing data to the plurality of banks, and the test control signal may be activated in response to each of the program pulses. For example, each of the plurality of program pulses may simultaneously activate at least two input/output lines.

In some embodiments, a number of input/output lines for writing a single unit of data to the plurality of banks may be 2*n, wherein n is a natural number, and the plurality of column redundancy write drivers may be configured to write the respective redundancy test data to the corresponding ones of the column redundancy cell arrays n times while the single unit of data is written to the plurality of banks.

In other embodiments, the device may further include a plurality of redundancy Y-decoders corresponding to respective ones of the plurality of column redundancy write drivers, and a plurality of redundancy sense amplifier corresponding to respective ones of the plurality of column redundancy write drivers. Also, the device may include a low redundancy cell array configured to be shared by the plurality of banks.

According to other embodiments of the present invention, in a method of testing a redundancy cell array of a phase-change random access memory (PRAM) device having a plurality of banks and a plurality of column redundancy cell arrays respectively corresponding to at least one of the plurality of banks, first to $n^{th}$ program pulses, wherein n is a natural number, are sequentially activated to read and/or write data to the plurality of banks. In response to each of the first to $n^{th}$ program pulses, a test control signal is activated, and test data is written to the plurality of column redundancy cell arrays in response to the test control signal. A test operation is performed to test the test data written to the plurality of column redundancy cell arrays.

According to still other embodiments of the present invention, in a method of accessing redundancy cell array of a phase-change random access memory (PRAM) device having a plurality of banks and a plurality of column redundancy cell arrays respectively corresponding to at least one of the plurality of banks, first to $n^{th}$ program pulses, wherein n is a natural number, are sequentially activated to read and/or write data to the plurality of banks. In response to each of the first to $n^{th}$ program pulses, a control signal is activated, and the plurality of column redundancy cell arrays are accessed in response to the control signal.

DETAILED DESCRIPTION OF EMBODIMENTS OF THE INVENTION

Figure 1:
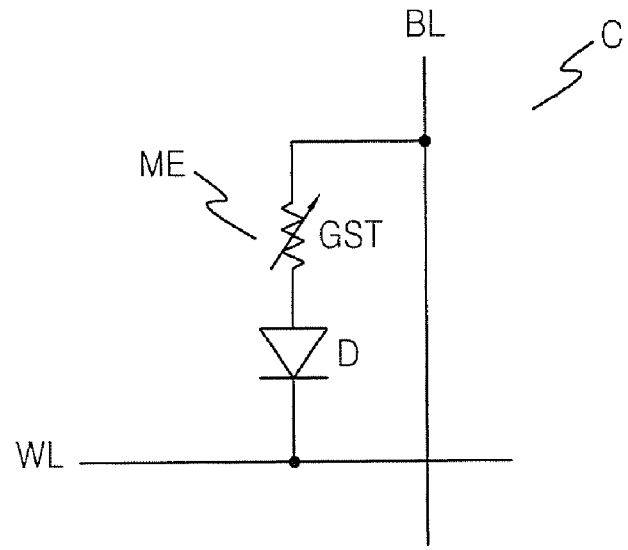
FIG. 1 is an equivalent circuit diagram of a unit cell of a phase-change random access memory (PRAM) device.
Figure 2:
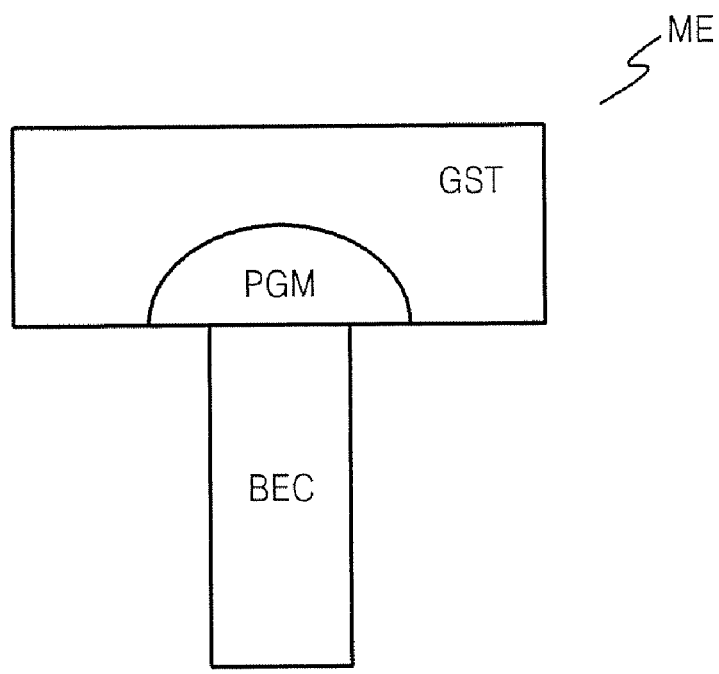
FIG. 2 is a cross-sectional view of a memory device including the phase-change material of FIG. 1.
Figure 3:
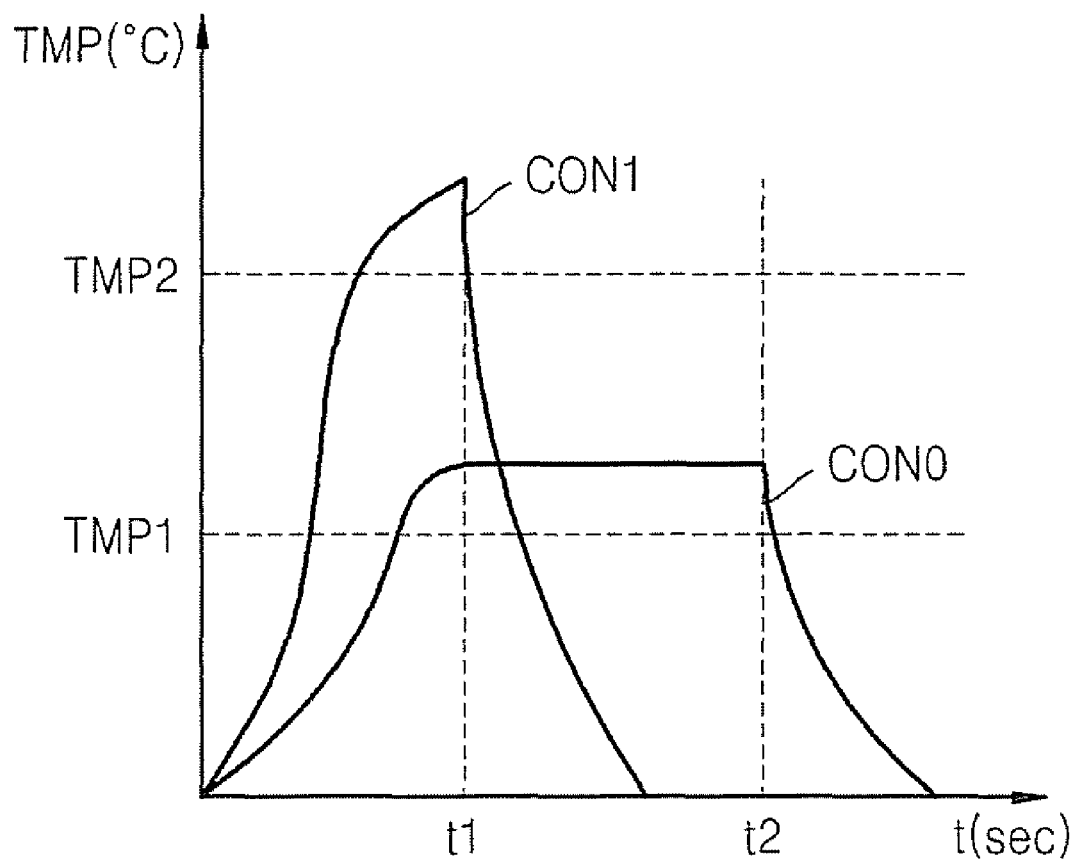
FIG. 3 is a graph illustrating characteristics of the phase-change material of FIGS. 1 and 2.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

Figure 4:
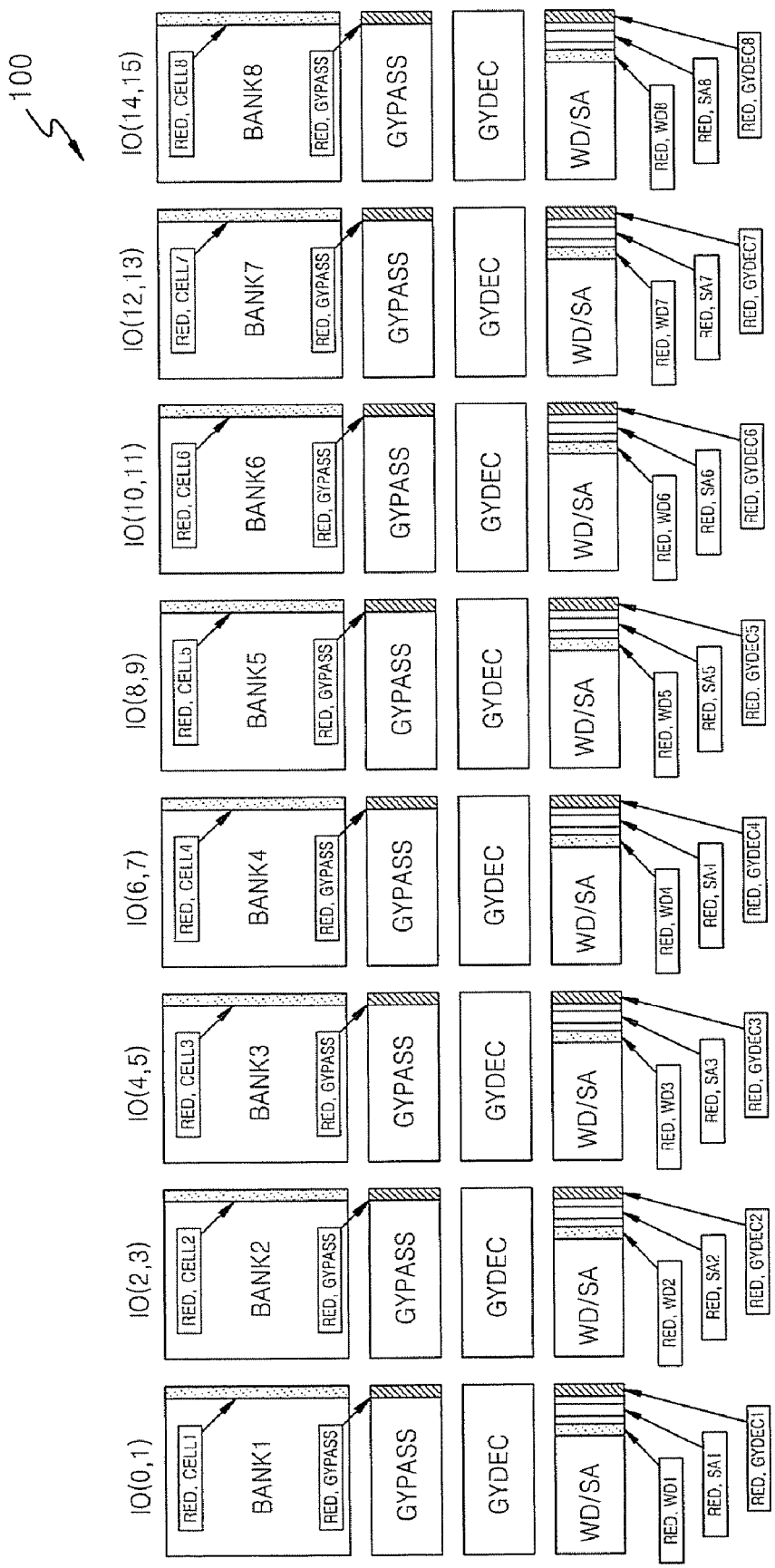
FIG. 4 is a diagram of a PRAM device according to some embodiments of the present invention.

FIG. 4 is a diagram of a phase-change random access memory (PRAM) 100 device according to some embodiments of the present invention.

Referring to FIG. 4, the PRAM device 100 includes a plurality of banks (BANK1, BANK2, . . . , BANK8), column redundancy cell arrays (RED.CELL1, RED.CELL2, . . . , RED.CELL8) and column redundancy write drivers (RED.WD1, RED.WD2, . . . , RED.WD8). Here, each of the banks (BANK1, BANK2, . . . , BANK8) includes a single column redundancy cell array (RED.CELL1, RED.CELL 2, . . . , RED.CELL8). For example, a first bank (BANK1) includes a first column redundancy cell array (RED.CELL1), and a second bank (BANK2) includes a second column redundancy cell array (RED.CELL2). Likewise, an eighth bank (BANK8) includes an eighth column redundancy cell array (RED.CELL8).

FIG. 4 illustrates the PRAM device 100 including eight banks, and thus the PRAM device 100 respectively includes first to eighth column redundancy cell arrays (RED.CELL1, RED.CELL2, . . . , RED.CELL8). In some embodiments, at least two banks may share a single column redundancy cell array.

Each of the banks (BANK1, BANK2, . . . , BANK8) includes a single column redundancy write driver (RED.WD1, RED.WD2, . . . , RED.WD8). That is, a single column redundancy write driver per a single column redundancy cell array is included. For example, a first column redundancy write driver (RED.WD1) corresponding to a first column redundancy cell array (RED.CELL1) is included, and a second column redundancy write driver (RED.WD2) corresponding to a second column redundancy cell array (RED.CELL2) is included. Likewise, an eighth column redundancy write driver (RED.WD8) corresponding to an eighth column redundancy cell array (RED.CELL8) is included.

Since FIG. 4 illustrates the PRAM device 100 including eight column redundancy cell arrays (RED.CELL1, RED.CELL2, . . . , RED.CELL8), the PRAM device 100 respectively includes first to eighth column redundancy write drivers (RED.WD1, RED.WD2, . . . , RED.WD8). In some embodiments, at least two column redundancy cell arrays may share a single column redundancy write driver.

Referring to FIG. 4, each of the column redundancy write drivers (RED.WD1, RED.WD2, . . . , RED.WD8) transmits redundancy test data to its corresponding column redundancy cell array in response to a test control signal. Here, the redundancy test data indicates data applied to redundancy cells in order to detect defects, and is synchronized with the test control signal to be applied to the redundancy cells.

The redundancy write drivers (RED.WD1, RED.WD 2, . . . , RED.WD8) of the PRAM device 100 may simultaneously activate the column redundancy cell arrays (RED. CELL1, RED.CELL2, . . . , RED.CELL8) of all banks (BANK1, BANK2, . . . , BANK8) in response to the single test control signal, as will be described in more detail later.

Here, the test control signal may be activated by a respective program pulse that activates its corresponding pair of input/output lines (IO0, IO1, IO15) in order to write normal data to the banks (BANK1, BANK2, . . . , BANK8).

Figure 5:
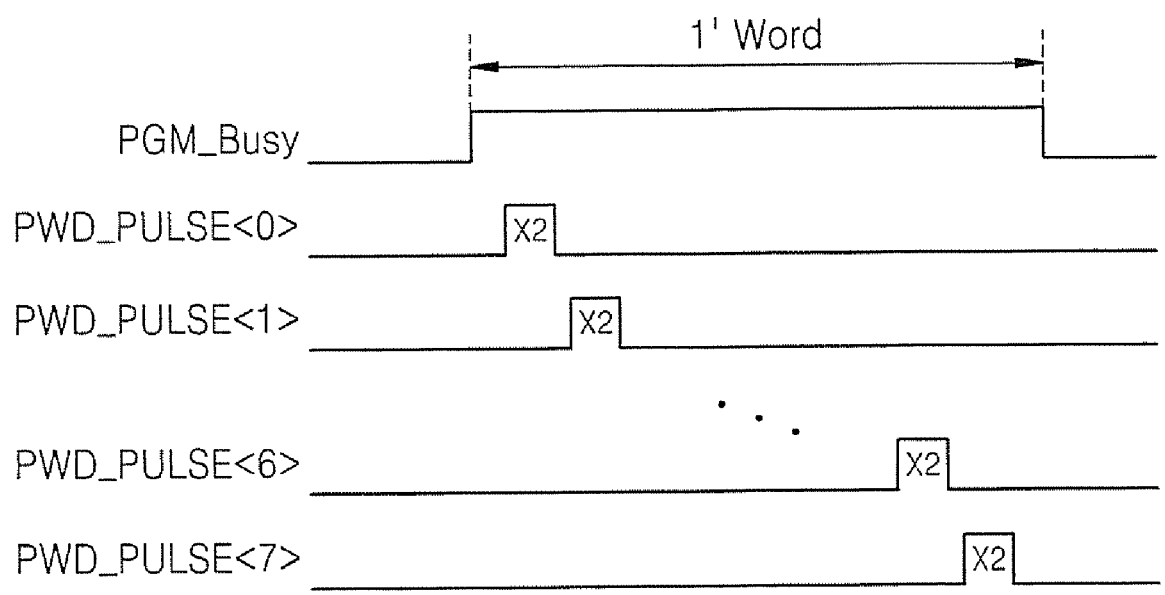
FIG. 5 illustrates the timing of program pulses of the PRAM device of FIG. 4, in which each program pulse activates a corresponding pair of input/output lines.

FIG. 5 shows timing of the program pulses of the PRAM device 100, illustrated in FIG. 4, which activate its corresponding pair of input/output lines (IO0, IO1, . . . , IO15).

Referring to FIGS. 4 and 5, each of the program pulses (PWD_PULSE<0>, PWD_PULSE<1>, . . . , PWD_PULSE<7>) can simultaneously activate a pair of input/output lines. For example, a first input/output line (IO0) and a ninth input/output line (IO8) may be activated in response to a first program pulse (PWD_PULSE<0>), and a second input/output line (IO1) and a tenth input/output line (IO9) may be activated in response to a second program pulse (PWD_PULSE<1>). Here, the first to eighth program pulses (PWD_PULSE<0>, PWD_PULSE<1>, . . . , PWD_PULSE<7>) may be sequentially activated.

The PRAM device 100 of FIG. 4 includes 16 input/output lines (IO0, IO1, . . . , IO15) for reading and writing normal data to the banks (BANK1, BANK2, . . . , BANK8). Accordingly, 8 program pulses (PWD_PULSE<0>, PWD_PULSE<1>, . . . , PWD_PULSE<7>) are required to write a single normal data to the banks (BANK1, BANK2, . . . , BANK8).

Figure 6:
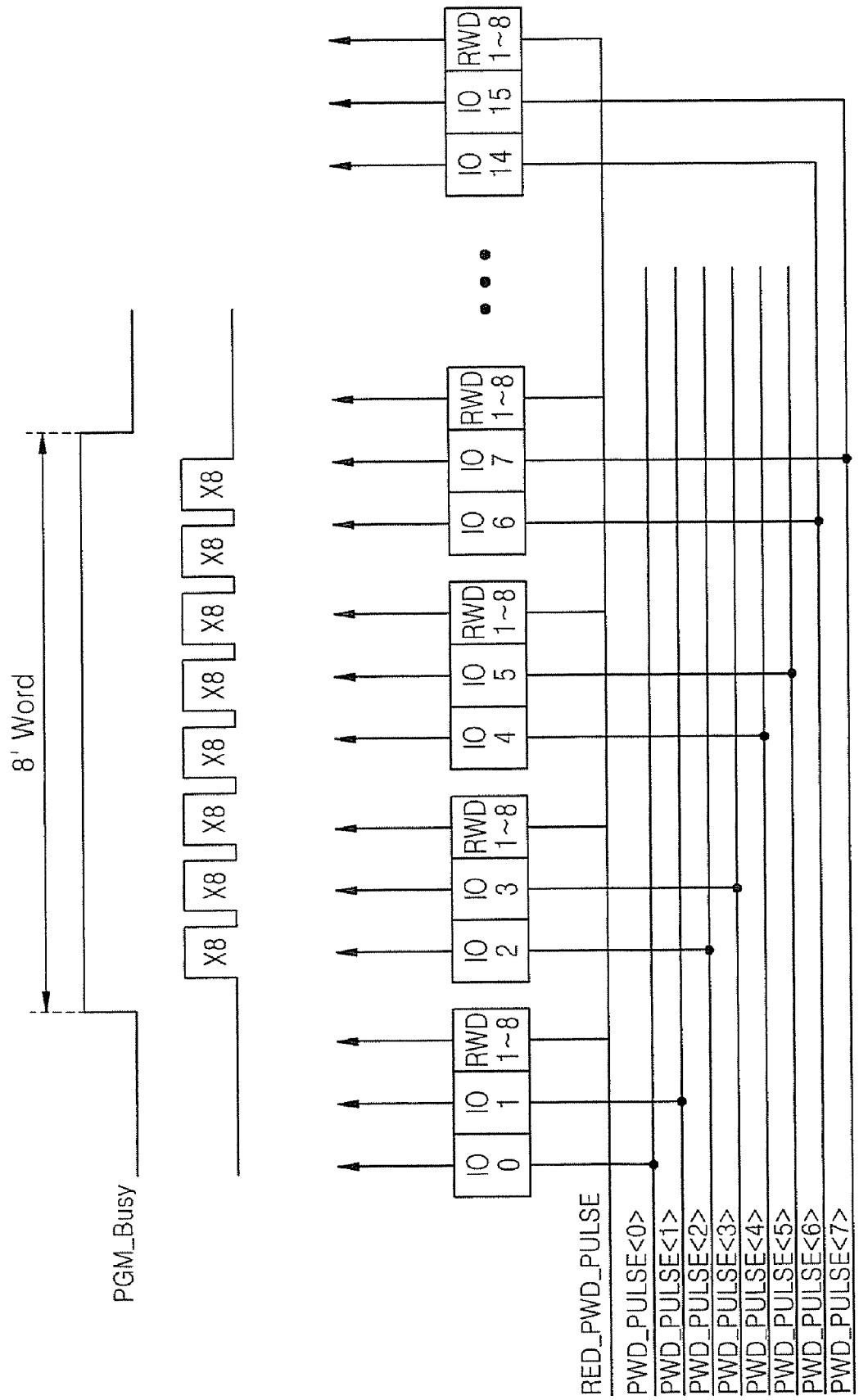
FIG. 6 illustrates the timing of a test control signal of the PRAM device of FIG. 4, which activates column redundancy cell arrays.

FIG. 6 shows timing of a test control signal of the PRAM device 100, illustrated in FIG. 4, which activates the column redundancy cell arrays.

Referring to FIGS. 4 and 6, the test control signal (RED_PWD_PULSE) is activated whenever the first to eighth program pulses (PWD_PULSE<0>, PWD_PULSE<1>, . . . , PWD_PULSE<7>) are activated. That is, if the eighth program pulse (PWD_PULSE<7>) is activated, the test control signal (RED_PWD_PULSE) is activated eight times.

For example, the test control signal (RED_PWD_PULSE) is activated once in response to the first program pulse (PWD_PULSE<0>). Here, all of the column redundancy cell arrays are activated, with the first input/output line (IO0) and the ninth input/output line (IO8) corresponding to the first program pulse (PWD_PULSE<0>).

Here, since the column redundancy cell array (RED.CELL1, RED.CELL2, . . . , RED.CELL8) which is included in the 8 banks (BANK1, BANK2, . . . , BANK8) of the PRAM device 100 of FIG. 4 includes a single input/output line (not shown) for inputting and outputting redundancy (test) data, 8 bit (1 word) redundancy test data is written in response to the single test control signal (RED_PWD_PULSE). Thus, 8 word redundancy test data may be written while 1 word normal data is written in the PRAM device 100.

Thus, since each of the banks of a PRAM device according to some embodiments of the present invention includes a column redundancy cell array, and a single program pulse activates the column redundancy cell array of all banks, several redundancy test data may be written while a single normal data is written. Therefore, the speed of a redundancy cell test may be increased.

Referring to FIG. 4, the PRAM device 100 may further include a redundancy Y-decoder (RED.GYDEC1, RED.GYDEC2, . . . , RED.GYDEC8) and a redundancy sense amplifier (RED.SA1, RED.SA2, . . . , RED.SA8) corresponding to each of the column redundancy write drivers. (RED.WD1, RED.WD2, . . . , RED.WD8).

In addition, the PRAM device 100 may further include a low redundancy cell array (not shown) which is shared by all banks (BANK1, BANK2, . . . , BANK8). Since the low redundancy cell array includes the same number of input/output lines as the input/output lines of the banks, the speed of a redundancy cell test or access is not reduced although each of the banks does not include its corresponding low redundancy cell array.

Figure 7:
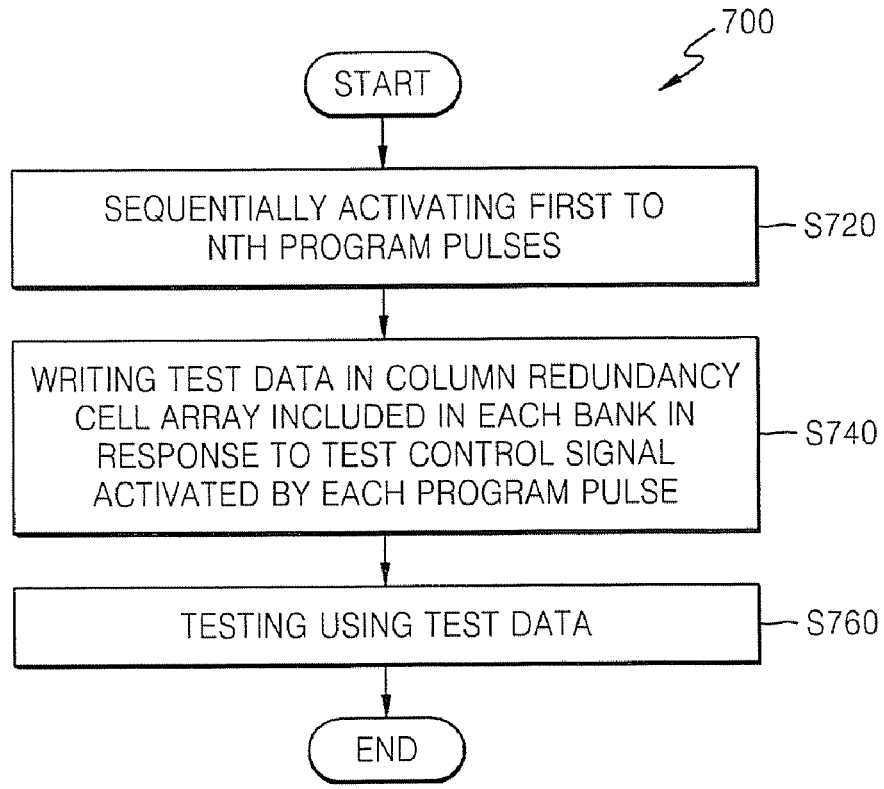
FIG. 7 is a flowchart illustrating methods of testing redundancy cell arrays according to some embodiments of the present invention.

FIG. 7 is a flow chart illustrating a method 700 of testing the column redundancy cell arrays, according to some embodiments of the present invention.

Referring to FIG. 7, the method 700 of testing the column redundancy cell arrays of the PRAM device 100 includes: sequentially activating at least one input/output line in response to sequentially applied first to $n^{th}$ program pulses among first to $n*m^{th}$ input/output lines, wherein n and m are natural numbers, to read and write normal data in banks (S720); receiving a test control signal activated in response to each of the first to $n^{th}$ program pulses and writing test data to a corresponding column redundancy cell array (S740); and testing the column redundancy cell arrays using the test data written to the column redundancy cell array (S760), wherein the PRAM device 100 includes: a plurality of banks (BANK1, BANK2, . . . , BANK8); column redundancy cell arrays (RED.CELL1, RED.CELL2, . . . , RED.CELL8); and column redundancy write drivers (RED.WD1, RED.WD2, . . . , RED.WD8).

Figure 8:
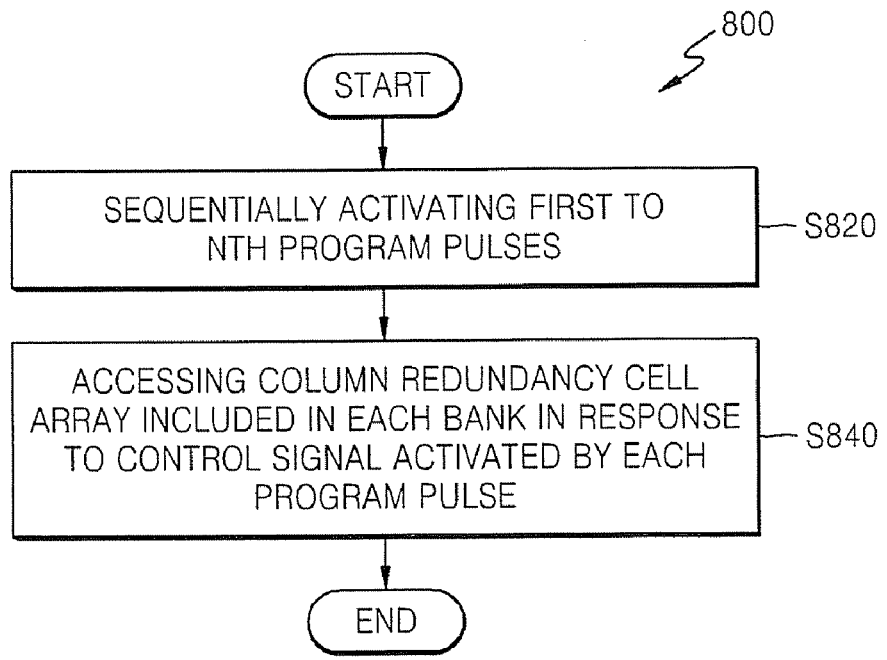
FIG. 8 is a flowchart illustrating methods of accessing redundancy cells according to some embodiments of the present invention.

FIG. 8 is a flow chart illustrating a method 800 of accessing the column redundancy cell arrays, according to an embodiment of the present invention.

Referring to FIG. 8, the method 800 of accessing the column redundancy cell arrays of the PRAM device 100 includes: sequentially activating at least one input/output line in response to sequentially applied first to $n^{th}$ program pulses among first to $n*m^{th}$ input/output lines, wherein n and m are natural numbers, to read and write normal data to banks (S820); and receiving a control signal activated in response to each of the first to $n^{th}$ program pulses and accessing a corresponding column redundancy cell array (S840), wherein the PRAM device 100 includes: a plurality of banks (BANK1, BANK2, . . . , BANK8); column redundancy cell arrays (RED.CELL1, RED.CELL2, . . . , RED.CELL8); and column redundancy write drivers (RED.WD1, RED.WD2, . . . , RED.WD8).

Figure 9:
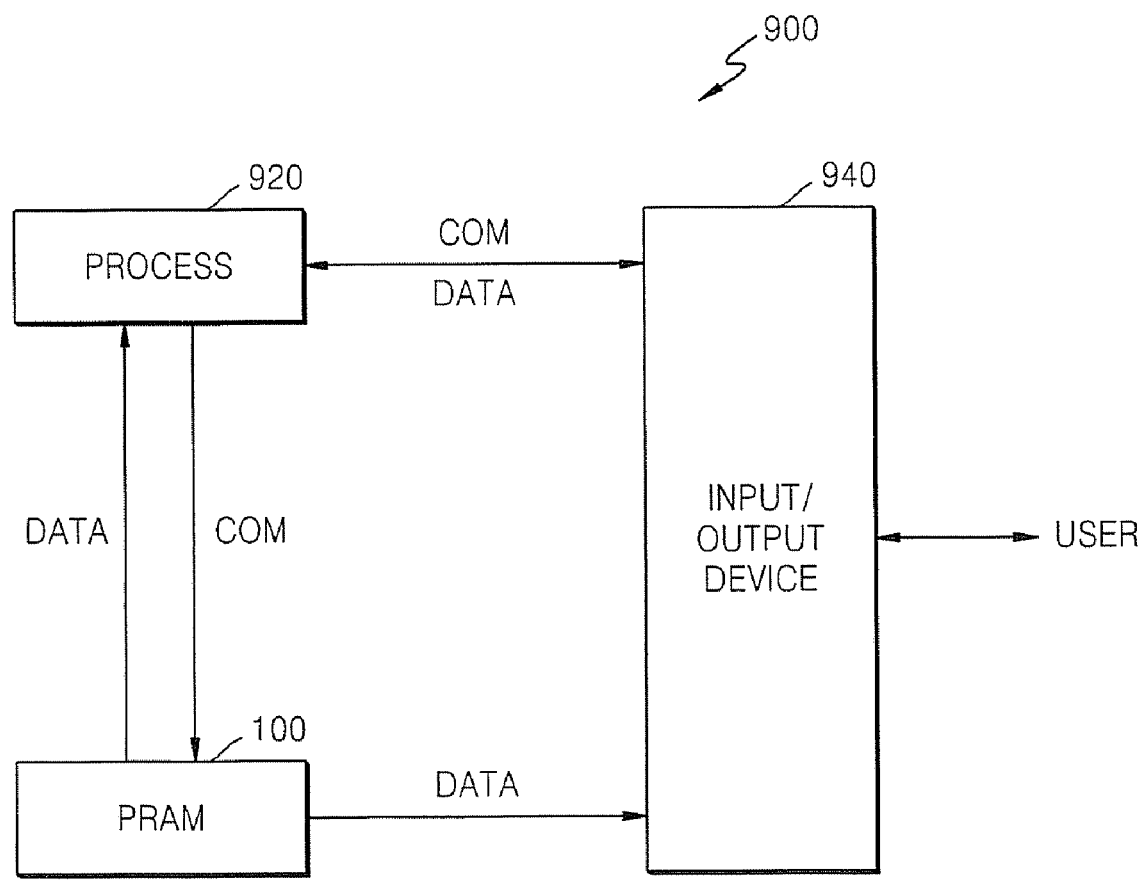
FIG. 9 is a block diagram illustrating a memory system including PRAM devices according to some embodiments of the present invention.

FIG. 9 is a block diagram illustrating a memory system 900 including the PRAM device 100, according to some embodiments of the present invention.

Referring to FIG. 9, the memory system 900 includes a processor 920, the PRAM device 100 and an input/output device 940. The processor 920 in the PRAM device 100 transmits commands COM required for read and write operations or tests. The PRAM device 100 receives commands COM from the processor 920 and performs corresponding operations. The results obtained from the PRAM device 100 (data output, etc.) are transmitted to users via the input/output device 940.

The PRAM device used in the method of testing redundancy cell array 700, the method of accessing redundancy cell array 800, and the memory system 900 may be the same as the PRAM device of FIG. 4 in some embodiments, and thus will not be further described herein.

According to some embodiments of the present invention, in a method of testing redundancy cell array and/or a method of accessing redundancy cells, the speed of redundancy cell tests can be increased by writing a plurality of redundancy data (or redundancy test data) while a single normal data is written, since each bank includes a column redundancy cell array and a single program pulse activates the column redundancy cell arrays of all banks.

While the present invention has been particularly shown and described with reference to exemplary embodiments thereof, it will be understood by one of ordinary skill in the art that various changes in form and details may be made therein without departing from the spirit and scope of the present invention as defined by the following claims.

That which is claimed:

1. A method of testing a redundancy cell array of a phase-change random access memory (PRAM) device comprising a plurality of banks and a plurality of column redundancy cell arrays, each of the redundancy cell arrays respectively corresponding to at least one of the banks, the method comprising:
    sequentially activating first to $n^{th}$ program pulses, wherein n is a natural number, to read and/or write data to the plurality of banks;
    in response to each of the first to $n^{th}$ program pulses, activating a test control signal and writing test data to the plurality of column redundancy cell arrays in response to the test control signal; and
    performing a test operation to test the test data written to the plurality of column redundancy cell arrays.

2. The method of claim 1, wherein each of the plurality of banks includes one of the column redundancy cell arrays, and wherein writing the test data to the plurality of column redundancy cell array comprises:
    transmitting the test data to the plurality of column redundancy cell arrays simultaneously in response to the test control signal.

3. The method of claim 1, wherein the test control signal is activated during activation of each of the first to $n^{th}$ program pulses.

4. The method of claim 1, wherein activating each of the first to $n^{th}$ program pulses simultaneously activates m input/output lines of the plurality of banks.

5. The method of claim 4, wherein n is 8 and m is 2.

6. The method of claim 4, wherein writing the test data comprises:
    writing the test data n times while a single unit of data is written to the plurality of banks.

7. A method of accessing a redundancy cell array of a phase-change random access memory (PRAM) device comprising a plurality of banks and a plurality of column redundancy cell arrays, each of the redundancy cell arrays respectively corresponding to at least one of the banks, the method comprising:
    sequentially activating first to $n^{th}$ program pulses, wherein n is a natural number, to read and/or write data to the plurality of banks; and
    in response to each of the first to $n^{th}$ program pulses, activating a control signal and accessing the plurality of column redundancy cell arrays in response to the control signal.

8. The method of claim 7, wherein each of the plurality of banks includes one of the column redundancy cell arrays, and wherein accessing the plurality of column redundancy cell arrays comprises:
    accessing redundancy data in the plurality of column redundancy cell arrays simultaneously in response to the control signal.

9. The method of claim 7, wherein the control signal is activated during activation of each of the first to $n^{th}$ program pulses.

10. The method of claim 7, wherein activating each of the first to $n^{th}$ program pulses simultaneously activates m input/output lines of the plurality of banks.

11. The method of claim 10, wherein n is 8 and m is 2.

12. The method of claim 10, wherein accessing the plurality of column redundancy cell arrays comprises:
    accessing the plurality of column redundancy cell arrays n times while a single unit of data is written to the plurality of banks.

* * * * *